(12) United States Patent
Kim et al.

(10) Patent No.: US 12,476,093 B2
(45) Date of Patent: Nov. 18, 2025

(54) CERAMIC SUSCEPTOR HAVING HYBRID COATING

(71) Applicant: KSM COMPONENT CO., LTD., Gimpo-si (KR)

(72) Inventors: Yun Ho Kim, Gimpo-si (KR); Joo Hwan Kim, Gimpo-si (KR); Hwan Young Park, Gimpo-si (KR); Bo Sung Kim, Gimpo-si (KR); Hyun Taek Lee, Gimpo-si (KR)

(73) Assignee: KSM COMPONENT CO., LTD., Gimpo-si (KR)

( * ) Notice: Subject to any disclaimer, the term of this patent is extended or adjusted under 35 U.S.C. 154(b) by 0 days.

(21) Appl. No.: 18/806,817

(22) Filed: Aug. 16, 2024

(65) Prior Publication Data
US 2025/0329518 A1    Oct. 23, 2025

(30) Foreign Application Priority Data

Apr. 17, 2024 (KR) .................. 10-2024-0051251

(51) Int. Cl.
*C04B 35/117* (2006.01)
*C04B 41/00* (2006.01)
*C04B 41/50* (2006.01)
*C04B 41/87* (2006.01)
*H01J 37/32* (2006.01)
*H01L 21/48* (2006.01)
*H01L 21/687* (2006.01)

(52) U.S. Cl.
CPC ...... *H01J 37/32724* (2013.01); *C04B 35/117* (2013.01); *C04B 41/009* (2013.01); *C04B 41/5045* (2013.01); *H01J 37/32495* (2013.01)

(58) Field of Classification Search
None
See application file for complete search history.

(56) References Cited

U.S. PATENT DOCUMENTS

| 4,956,318 A | * | 9/1990 | Moskowitz | ........... C04B 35/111 |
| | | | | 407/119 |
| 9,976,211 B2 | | 5/2018 | Firouzdor et al. | |
| 10,815,562 B2 | | 10/2020 | Firouzdor et al. | |
| 11,230,502 B2 | | 1/2022 | Yagi et al. | |

(Continued)

FOREIGN PATENT DOCUMENTS

| CN | 1414929 A | 4/2003 |
| CN | 116274985 A | 6/2023 |

(Continued)

OTHER PUBLICATIONS

Dheeraj Varanasi, et al., "Processing of Al2O3-AlN Ceramics and Their Structural, Mechanical, and Tribological Characterization", Materials, 2021, pp. 1-15, vol. 14, No. 6055.

(Continued)

*Primary Examiner* — David Sample
(74) *Attorney, Agent, or Firm* — Sughrue Mion, PLLC

(57) ABSTRACT

A ceramic susceptor is disclosed, which not only has excellent volumetric resistance at high temperatures and thermal conductivity at room temperature compared to conventional ceramic susceptors, but also has excellent plasma resistance without peeling of the coating layer even in high temperature environments, and thus has the effect of reducing particles.

11 Claims, 6 Drawing Sheets

(56) References Cited

U.S. PATENT DOCUMENTS

| | | | |
|---|---|---|---|
| 11,251,061 B2 | 2/2022 | Kim et al. | |
| 11,955,320 B2 | 4/2024 | Lee et al. | |
| 12,154,799 B2 | 11/2024 | Jin | |
| 2004/0222211 A1 | 11/2004 | Hiramatsu et al. | |
| 2005/0211703 A1* | 9/2005 | Kiku | H05B 6/806 |
| | | | 219/730 |
| 2012/0056807 A1 | 3/2012 | Chapman et al. | |
| 2017/0140902 A1* | 5/2017 | Simpson | B32B 18/00 |
| 2018/0251406 A1 | 9/2018 | Sun et al. | |
| 2023/0013637 A1* | 1/2023 | Aguilar Santillan | |
| | | | C23C 16/405 |
| 2023/0141782 A1 | 5/2023 | Fenwick et al. | |
| 2023/0223240 A1 | 7/2023 | Pape et al. | |
| 2023/0349045 A1 | 11/2023 | Okubo et al. | |
| 2024/0430989 A1* | 12/2024 | Kim | H05B 3/265 |
| 2025/0136515 A1* | 5/2025 | Kim | H01L 21/68757 |

FOREIGN PATENT DOCUMENTS

| | | |
|---|---|---|
| CN | 116813352 A | 9/2023 |
| JP | 2001-358207 A | 12/2001 |
| JP | 2004-22382 A | 1/2004 |
| JP | 2019-167288 A | 10/2019 |
| JP | 2021-521653 A | 8/2021 |
| JP | 2023-47311 A | 4/2023 |
| KR | 10-2013-0010557 A | 1/2013 |
| KR | 10-2017-0141340 A | 12/2017 |
| KR | 10-2088493 B1 | 3/2020 |
| KR | 10-2270157 B1 | 6/2021 |
| KR | 10-2353957 B1 | 1/2022 |
| KR | 10-2369346 B1 | 3/2022 |
| KR | 10-2388784 B1 | 4/2022 |
| KR | 10-2493316 B1 | 1/2023 |
| KR | 10-2023-0027281 A | 2/2023 |
| TW | 200619169 A | 6/2006 |
| TW | 201841868 A | 12/2018 |
| TW | 202246549 A | 12/2022 |
| WO | 2020/237979 A1 | 3/2020 |

OTHER PUBLICATIONS

European Patent Office, Communication issued Oct. 10, 2025 in copending Application No. EP 25 16 8789.

\* cited by examiner

FIG. 3

| Classification | After coating | Joint Surface |
|---|---|---|
| Comparative Example 6 (SPS/AD Coating) | | First coating layer / Joint surface / Ceramic plate layer (50μm) |
| Comparative Example 6 (SPS/AD Coating) + 500°C Heat Treatment | | Unable to measure due to peeling |

FIG. 4

| Classification | After coating | Joint Surface |
|---|---|---|
| Example 1 (100% $Y_2O_3$ Hot Press) | | First coating layer → Joint surface → Ceramic plate layer |
| Example 1 (100% $Y_2O_3$ Hot Press) + 500°C Heat Treatment | | First coating layer → Joint surface → Ceramic plate layer |

FIG. 5

| Classification | After coating | Joint Surface |
|---|---|---|
| Example 5 (100% $Y_2O_3$ $YF_3$ Sputtering) | | 2nd coating layer / 1st coating layer / Reaction Layer / Ceramic plate layer |
| Example 5 (100% $Y_2O_3$ $YF_3$ Sputtering) + 500°C Heat Treatment | | 2nd coating layer / 1st coating layer / Reaction Layer / Ceramic plate layer |

FIG. 6

| | Surface | Porosity (%) | Joint surface Image | Plasma resistance test (etch rate [nm/min]) |
|---|---|---|---|---|
| Comparative Example 6 | | 7.22 | | 4.88 |
| Example 1 | | 1.49 | | 3.75 |
| Example 2 | | 1.42 | | 1.67 |
| Example 3 | | 1.38 | | 1.58 |
| Example 4 | | 1.51 | | 2.25 |
| Example 5 | | 0.02 | | 0.35 |

CERAMIC SUSCEPTOR HAVING HYBRID COATING

TECHNICAL FIELD

The present invention relates to a ceramic susceptor including a hybrid coating, and more specifically, to a ceramic susceptor including a hybrid coating, which not only has particularly excellent volumetric resistance at high temperatures and thermal conductivity at room temperature, but also improves plasma resistance and reduces the generation of particles, as compared to conventional ceramic susceptors.

BACKGROUND ART

As recent semiconductor processes have developed into larger diameter equipment along with micronization of processes and high integration to improve the yield, the use of high-output plasma is inevitable, and processes are performed in harsh environments at high temperatures.

In the process field for etching semiconductor devices or realizing other ultra-fine shapes, a vacuum plasma equipment using high-temperature plasma is widely used. In addition, such vacuum plasma equipment includes a plasma enhanced chemical vapor deposition (PECVD) equipment, which forms a deposition film on a substrate using a chemical vapor deposition method using plasma, a sputtering equipment to physically form a deposition film, and a dry etching equipment to etch the substrate or material coated on the substrate into a specific pattern, etc.

Since high-temperature plasma is generated inside this vacuum plasma equipment, the chamber and its internal components are likely to be damaged. In addition, there is a high possibility that certain elements and contaminant particles will be generated from the surface of the chamber and the parts provided inside it, thereby contaminating the interior of the chamber. In particular, in the case of plasma etching equipment, since reactive gases such as F and Cl are injected under a plasma atmosphere, the inner wall of the chamber and its internal components are inevitably placed in a very corrosive environment. Generally, this corrosion primarily causes chemical and physical damage to the chamber and the parts provided therein, and secondarily generates contaminants and particles, causing an increase in the defect rate and a decrease in quality of products manufactured through processes inside the chamber.

In addition, if the chamber and the parts provided within it are damaged, since some of the damaged equipment needs to be replaced, cleaned, or repaired, additional costs are incurred, and since the process line must be stopped for this, the process time required to manufacture the product is also increased. For these reasons, metal susceptors installed inside existing chambers are being replaced by ceramic susceptors. Examples of such ceramic susceptors comprise aluminum nitride (AlN) sintered body or alumina ($Al_2O_3$) sintered body with excellent thermal conductivity. In addition, these ceramic susceptors are mainly used in heaters or electrostatic chucks for the semiconductor manufacturing process.

In the case of aluminum nitride, it is stable at high temperatures and has physical properties such as excellent electrical insulating properties and thermal conductivity. Also, since it has a thermal expansion coefficient similar to silicon, it is mainly used in semiconductor manufacturing devices that require high electrical resistance at high temperatures. Alumina is also a material that is stable at high temperatures and has better electrical insulating properties and higher hardness than aluminum nitride.

However, even in the case of these recent ceramic susceptors, these do not satisfy ceramic properties such as volume resistance and thermal conductivity to withstand the harsher high-temperature process environment. In the case of aluminum nitride, the volumetric resistance decreases rapidly at 500° C., which tends to cause leakage current, and in the case of alumina, there is a problem that the thermal conductivity at room temperature is very low, at the level of 20 to 30 W/m·k. If the thermal conductivity at room temperature is only 20 to 30 W/m·k, there are problems that the temperature uniformity deviation is increased and the yield is decreased. In addition, if the temperature uniformity deviation of the thermal conductivity is large, the life time of the product may be shortened due to the thermal stress and thermal shock.

In addition, even when using ceramic members such as aluminum nitride sintered body or alumina sintered body, not only does corrosion resistance still deteriorate due to plasma, but there is also a problem of contamination particles being generated from the surface of the member due to halogen gas (F, Cl, Br, I, etc.). Accordingly, in the art, an attempt was made to improve plasma corrosion resistance by coating the surface of the ceramic member with fluorine-based materials such as YOF, AlF, LaF, and $YF_3$, which have plasma corrosion resistance, or yttrium oxide ($Y_2O_3$), etc. using methods such as plasma spray coating, room temperature deposition (aerosol deposition), PVD or CVD. However, in this case, the relative density is low, and thus the coating layer peels off from the base material or pores are formed in the coating layer, which not only reduces plasma corrosion resistance but also causes the powder that makes up the coating layer to be lost, thereby causing problems that generate fine particles and increase process costs.

Therefore, there is a need for a ceramic member which has excellent volume resistance and thermal conductivity even in recent semiconductor processes using high-temperature environments and high-output plasma and can improve plasma resistance and corrosion resistance to halogen gas by coating a component having plasma corrosion resistance on the surface of a ceramic member in a way that the coating layer does not peel off from the base material and does not generate fine particles.

Prior Art Document

Patent Document (Patent document 1) KR 10-2369346 B1

DISCLOSURE

Technical Problem

It is an object of the present invention to provide a ceramic susceptor which not only has particularly excellent volumetric resistance at high temperatures and thermal conductivity at room temperature as compared to the conventional ceramic susceptor, but also can improve plasma resistance and particle resistance by forming a stable coating interface between the coating layer included in the susceptor and the sintered body.

Technical Solution

In order to achieve the above object, the present invention provides a ceramic susceptor comprising a ceramic plate layer; and a coating layer located on the ceramic plate layer, wherein the ceramic plate layer contains alumina ($Al_2O_3$); and aluminum nitride (AlN) and does not contain an aluminum oxynitride phase (AlON phase), and it comprises a reaction layer formed by reactive sintering at the interface between the ceramic plate layer and the coating layer.

Advantageous Effects

According to the ceramic susceptor according to the present invention, as compared to conventional ceramic susceptors, it not only has particularly excellent volumetric resistance at high temperatures and thermal conductivity at room temperature compared to conventional ceramic susceptors, but also has stable coating interface between the coating layer included in the susceptor and the sintered body, and has excellent plasma resistance and particle resistance.

DESCRIPTION OF DRAWINGS

FIG. 3 is a diagram showing a surface photograph and a scanning electron microscope (SEM) image of the joint surface before and after heat treatment at 500° C. of Comparative Example 6 according to an embodiment of the present invention.

FIG. 4 is a diagram showing a surface photograph and a SEM image of the joint surface before and after heat treatment at 500° C. of Example 1 according to an embodiment of the present invention.

FIG. 5 is a diagram showing a surface photograph and a SEM image of the joint surface before and after heat treatment at 500° C. of Example 5 according to an embodiment of the present invention.

FIG. 6 is a diagram showing surface photographs, porosity, SEM images of joint surfaces, and plasma resistance test results of Comparative Example 6 and Examples 1 to 5 according to an embodiment of the present invention.

BEST MODE

Figure 1:
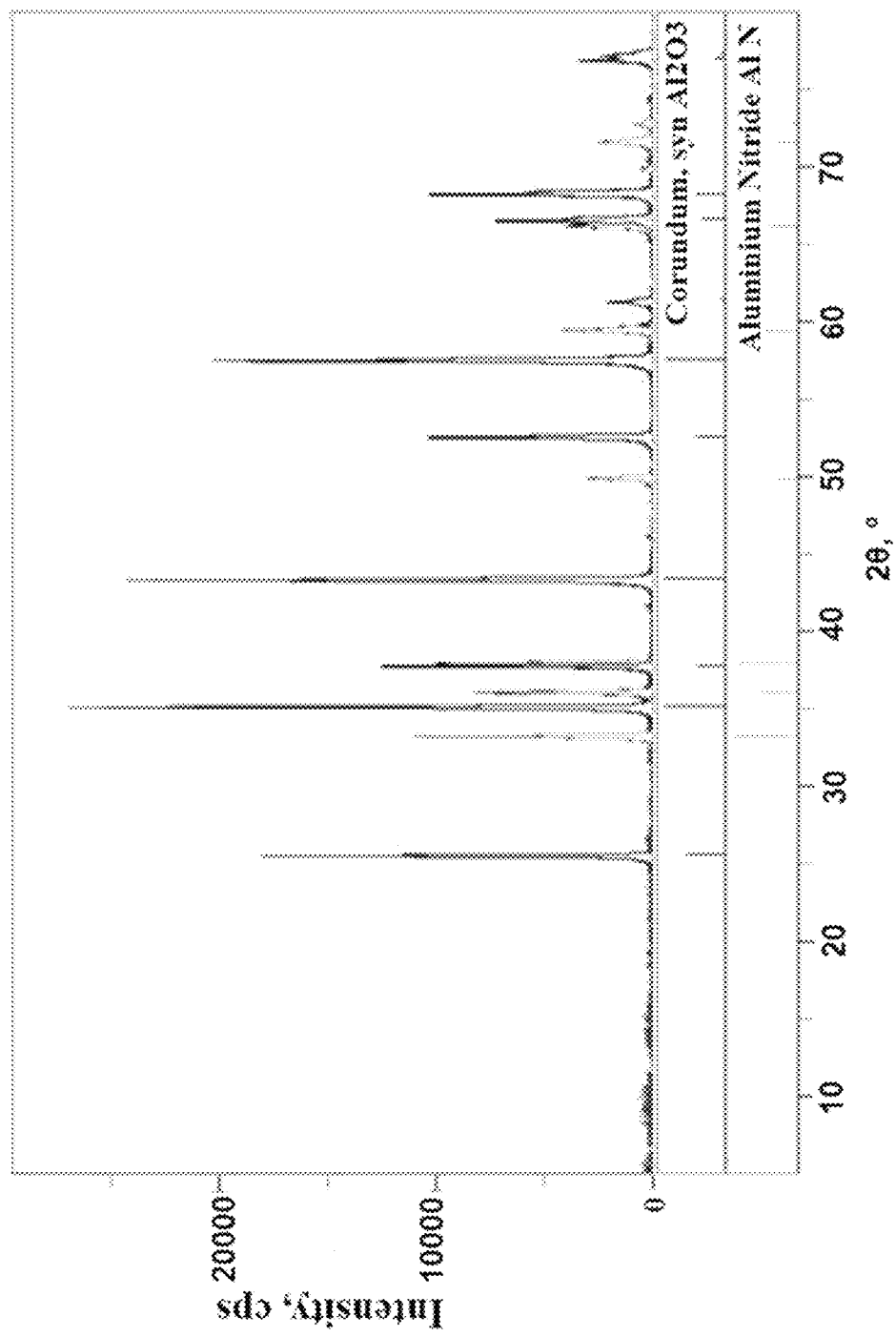
FIG. 1 is an XRD graph showing the composition of ceramic susceptor depending on sintering temperature.

Hereinafter, the present invention will be described in detail.

The ceramic susceptor according to one embodiment (a first embodiment) of the present invention is a ceramic susceptor including a ceramic plate layer; and a coating layer located on the ceramic plate layer, wherein the ceramic plate layer comprises alumina ($Al_2O_3$); and aluminum nitride (AlN) and does not comprise an aluminum oxynitride phase (AlON phase), and it comprises a reaction layer formed by reactive sintering at the interface between the ceramic plate layer and the coating layer.

As semiconductor processes are becoming more and more micronized and more highly integrated, it is inevitable to use high-output plasma, and accordingly, for etching semiconductor devices or realizing other ultra-fine shapes, a vacuum plasma equipment using high-temperature plasma is widely used. Accordingly, in the art, in place of the existing metal susceptor, a ceramic susceptor made of aluminum nitride (AlN) sintered body or alumina ($Al_2O_3$) sintered body, which has better plasma corrosion resistance, is used. In particular, recently, in order to refine the process and increase the diameter of the equipment for improving yield in semiconductor processes, the manufacturing process of semiconductors is carried out at 600 to 700° C. which is a harsher environment. In order to withstand this environment, the ceramic susceptor must satisfy the ceramic properties of a volumetric resistance of 1.0E+10 to 1.0E+13 Ω·cm at 500° C. and a thermal conductivity of 30 W/m·k to 60 W/m·k at room temperature However, in the case of aluminum nitride, the volumetric resistance decreases rapidly at 500° C., which tends to cause leakage current, and in the case of alumina, there is a problem that the thermal conductivity at room temperature is very low at the level of 20 to 30 W/m·k. If the thermal conductivity at room temperature is only 20 to 30 W/m·k, there are problems that temperature uniformity deviation is increased and the yield is decreased. Additionally, if the temperature uniformity deviation of thermal conductivity is large, the life time of the product may be shortened due to thermal stress and thermal shock. Accordingly, as a result of various studies, the present applicant has invented a ceramic susceptor that can be used at high temperatures of 500° C. or more, which can prevent leakage current by having high volumetric resistance even at temperatures of 500° C. or more, and solve the above problems because the thermal conductivity at room temperature is also higher than in the normal case.

The ceramic susceptor according to the first embodiment of the present invention use, as a ceramic plate layer, a sintered body comprising alumina ($Al_2O_3$), which not only has excellent electrical insulating property and high hardness, but is also stable at high temperature, and aluminum nitride (AlN), which is stable at high temperature and has physical properties of excellent electrical insulating property and thermal conductivity, as the main phase.

In particular, the present invention is characterized in that both problems that occur when alumina and aluminum nitride are used separately and problems that occur when alumina and aluminum nitride are not mixed at an optimal ratio are supplemented by mixing the alumina and aluminum nitride at an optimal ratio. Specifically, if alumina and aluminum nitride are mixed at an optimal ratio as in the present invention, secondary phases such as AlON phase are not generated (i.e., secondary phases including AlON phase are not included), and the alumina phase and aluminum nitride phase are evenly mixed and distributed without any change in the crystal phase, and thus the physical properties of the ceramic plate layer can be maximized. Also, in the process of manufacturing the ceramic plate layer, the creation of secondary phases can be more thoroughly prevented by performing the sintering process at the optimal temperature (temperature less than 1,650° C., preferably more than 1,300 C and less than 1,650° C.). Accordingly, the ceramic plate layer satisfies the ceramic properties of a volumetric resistance of 1.0E+10 to 1.0E+13 Ω·cm at 500° C. and a thermal conductivity of 30 W/m·k to 60 W/m·k at room temperature.

The ceramic plate layer according to the first embodiment of the present invention contains exceeding 68% by weight to less than 95% by weight, more preferably 70 to 80% by weight, and most preferably 73 to 77% by weight of alumina.

In addition, the ceramic plate layer according to the first embodiment of the present invention contains 5% by weight or more and less than 32% by weight, preferably 5 to 30% by weight, more preferably 20 to 30% by weight, and most preferably 23 to 27% by weight of aluminum nitride. If each of the alumina and aluminum nitride does not satisfy the above content range, the volumetric resistance at 500° C. or thermal conductivity at room temperature does not meet the requirements, and thus the ceramic plate layer does not satisfy the ceramic properties, which require volumetric resistance at 500° C. of 1.0E+10 to 1.0E+13 Ω·cm and thermal conductivity at room temperature of 30 W/m·k or more.

The purity of the alumina and aluminum nitride is preferably 99% or more, respectively, their particles are preferably nano-sized, and both are preferably used in the form of powder.

More specifically, the alumina particles may have nanometer sizes to micrometer sizes. For example, the alumina particles may be particles obtained by mixing alumina particles with a size of 3 to 5 μm and alumina particles with a size of 50 nm at a weight ratio of about 7:3 and then pulverizing them through a ball-mill process. However, the particle size and mixing ratio may vary greatly, and the ball mill process may be excluded, so it is not limited to the above examples.

Additionally, the average particle size (D50) of the aluminum nitride particles may be 0.5 to 1.5 μm, preferably 0.8 to 1.3 μm, and more preferably 0.9 to 1.2 μm. If the average particle size (D50) of the aluminum nitride particles is less than 0.5 μm, the reaction temperature is lowered, which may cause a problem that a secondary phase is created by reacting with alumina at low temperature. In addition, if the average particle size (D50) of the aluminum nitride particles exceeds 1.5 μm, an optimally dense/sufficiently dense structure with alumina is not formed, and thus, a problem may occur in which density is lowered during final sintering. In addition, in the present invention, it is desirable to exclude nanometer-sized aluminum nitride particles as much as possible.

Meanwhile, the ceramic plate layer according to the first embodiment may further comprise a dopant, if necessary. The dopant can be used to improve the thermal conductivity of the ceramic plate layer.

For example, when applying a normal sintered body to a substrate and using a ceramic heater or electrostatic chuck for semiconductors at a high temperature of 500° C. or higher, there are cases where the substrate is broken by thermal shock because it cannot keep up with the rapid change in temperature of the heating element. However, in order to improve the thermal shock resistance of the substrate, if the dopant is even mixed and applied to a heater or electrostatic chuck, the heat from the heating element can be efficiently transferred and the substrate can be prevented from being broken by thermal shock.

In addition, as the dopant of the present invention, any one or more of magnesium oxide (MgO), yttria ($Y_2O_3$), graphene, and rare earth complex oxides may be exemplified.

If the ceramic plate layer even comprises the dopant, the dopant may be comprised in an amount of 0.05 to 2 parts by weight, preferably 0.1 to 1 part by weight, and more preferably 0.2 to 0.8 parts by weight, based on the total weight of 100 parts by weight of alumina and aluminum nitride. If the dopant is comprised in an amount of less than 0.05 parts by weight or not comprised at all, based on the total weight of 100 parts by weight of alumina and aluminum nitride, the same problems that appeared in the prior art appear, or the effect that can be obtained by using dopant is significantly reduced, and thus the degree of improvement in thermal conductivity may not be sufficient, and non-sintering problems may also occur. In addition, if the content of the dopant exceeds 2 parts by weight based on the total weight of 100 parts by weight of alumina and aluminum nitride, the dispersion effect decreases, and thus rather, there may be a tendency for thermal conductivity to decrease and sintering density to decrease, and also due to the influence of the dopant, there may also be problems that the color of the product may be darken or the color of the corresponding dopant is expressed as is. In addition, all dopants used in the present invention preferably have a purity of 99% or more. In addition, it is preferable that each dopant is comprised in an amount of 0.05 to 0.5% by weight.

Magnesium oxide, which is one of the dopants, may be comprised to improve the thermal conductivity and volumetric resistance of the ceramic plate layer. Magnesium oxide can cause the formation of $MgAl_2O_4$ phase or MgAlON phase through sintering with alumina and/or aluminum nitride. If the $MgAl_2O_4$ phase or MgAlON phase is generated in excess, because the density can be lowered and thus rather, the thermal conductivity can be lowered, it is necessary to control the content of the ingredients even if the same ingredients are used. For example, in the present invention, at least one of the $MgAl_2O_4$ phase and the MgAlON phase included in the ceramic plate layer may be present in an amount of less than 1% by weight, preferably less than 0.8% by weight, and more preferably less than 0.6% by weight, based on the total weight of the ceramic plate layer. In addition, there is no particular limitation on the particle size of the magnesium oxide, but it is desirable to exclude nanometer-sized particles that may have a relatively weak effect.

The yttria ($Y_2O_3$) may be included to improve the thermal conductivity of the ceramic plate layer. The purity of the yttria is preferably 99% or more, and in terms of improving physical properties through densification, it is better for yttria particles to have a nano size, and it is desirable for yttria to be used in the form of powder. More specifically, the average particle size (D50) of yttria particles may be 50 to 150 nm, preferably 70 to 120 nm, and more preferably 90 to 100 nm. If the average particle size (D50) of yttria particles is less than 50 nm, even if it is contained in a trace amount, there is a risk that due to the characteristics of nanoscale yttria powder, problems such as the sintered body taking on the color of yttria particles (yellow, etc.) may occur. In addition, if the average particle size (D50) of the yttria particles exceeds 150 nm, an incomplete sintered body may be formed during sintering, and thus a problem of decreasing the thermal conductivity may occur due to the decrease in density. In particular, if the average particle size (D50) of yttria particles is at the micrometer level, these problems may become more prominent.

The graphene may also be comprised to improve the thermal conductivity of the ceramic plate layer. The purity of the graphene is preferably 99% or more, graphene particles have a nano size, and such graphene is preferably used in the form of powder (Graphene nano powder, GNP). More specifically, the average particle size (D50) of the graphene particles may be 0.1 to 1.5 nm, preferably 0.3 to 1 nm, and more preferably 0.5 to 0.8 nm. If the average particle size (D50) of the graphene particle is less than 0.1 nm, it may not be large enough to serve as a bridge between graphene particles, and thus the effect of improving the thermal conductivity may be insufficient or absent. In addition, if the average particle size (D50) of the graphene particles exceeds 1.5 nm, the graphene particles may become entangled with each other and may not be dispersed well, and thus a problem of reduction in thermal conductivity due to a decrease in density may occur.

Lastly, the rare earth complex oxides comprise two or more rare-earth metals selected from the group consisting of scandium (Sc), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (YB) and lutetium (Lu). It is desirable that the purity of rare earth complex oxides containing such rare-earth metals is 99% or higher. The shape of the rare earth complex oxides is preferably powder, and there is no particular limitation on the size of the powder particles.

The rare earth complex oxides can further improve the thermal conductivity of the ceramic plate layer, and also the time required for dechucking can be reduced by using the rare earth complex oxides. The rare earth complex oxides contain two or more rare-earth metals as described above, and may preferably contain 2 to 5 different rare-earth metals.

As the rare earth complex oxides containing 2 to 5 different rare-earth metals, complex oxides containing two different rare-earth metals, such as europium-gadolinium complex oxides ($EuGdO_X$), samarium-gadolinium complex oxides ($SmGdO_X$), cerium-europium complex oxides ($CeEuO_X$), samarium-cerium complex oxides ($SmCeO_X$), gadolinium-samarium complex oxides ($GdSmO_X$) and lanthanum-cerium complex oxides ($LaCeO_X$); complex oxides containing three different rare-earth metals, such as samarium-cerium-europium complex oxides ($SmCeEuO_X$), gadolinium-cerium-lanthanum complex oxides ($GdCeLaO_X$) and europium-gadolinium-samarium complex oxides ($EuGdSmO_X$); complex oxides containing four different rare-earth metals, such as samarium-cerium-gadolinium-europium complex oxides ($SmCeGdEuO_X$) and gadolinium-samarium-europium-lanthanum complex oxides ($GdSmEuLaO_X$); and complex oxides containing five different rare-earth metals, such as samarium-cerium-europium-gadolinium-lanthanum complex oxides ($SmCeEuGdLaO_X$) may be exemplified, and in addition, it can be used without particular restrictions as long as it contains 2 to 5 different rare-earth metals (oxides).

The rare earth complex oxides containing 2 to 5 different rare-earth metals may contain various types of rare-earth metals in various mixing ratios. For example, rare earth complex oxides containing 2 to 5 different rare-earth metals may contain two types of rare-earth metals (oxides) in a weight ratio of 2.5 to 3.5:1, three types of rare-earth metals (oxides) in a weight ratio of 1 to 3.5:0.5 to 2.5:1, four types of rare-earth metals (oxides) in a weight ratio of 1.5 to 3.5:0.5 to 2.5:1 to 2.5:1, or five types of rare-earth metals (oxides) in a weight ratio of 1 to 3:0.5 to 1.5:0.5 to 1.5:1 2:1, so that rare-earth metals (oxides) can be appropriately mixed to maximize the intended effect of rare earth complex oxides. For example, $SmCeEuO_X$ may have a weight ratio of each rare-earth metal (oxides) of 2:1:1, $GdCeLaO_X$ may have a weight ratio of each rare-earth metal (oxides) of 3:2:1, $EuGdSmO_X$ may have a weight ratio of each rare-earth metal (oxides) of 1.5:1.5:1, $SmCeGdEuO_X$ may have a weight ratio of each rare-earth metal (oxides) of 2:1:1.5:1, $GdSmEuLaO_X$ may have a weight ratio of each rare-earth metal (oxides) of 3:2:2:1, and $SmCeEuGdLaO_X$ may have a weight ratio of each rare-earth metal (oxides) of 2:1:1:1.5:1.

In the rare earth complex oxides, any one rare-earth metal may be solid-dissolved in the other (or any one) rare-earth metal oxide. Through this, the crystals of rare-earth metal oxides change, and thus, rare earth complex oxides may have increased oxygen lattice defects compared to single rare-earth metal oxide. In this way, rare earth complex oxides with increased oxygen lattice defects have improved interfacial reactivity, and thus can react effectively with the interface or lattice oxygen of the components within the ceramic plate layer.

In addition, as rare-earth metal oxides containing one rare-earth metal, scandium oxide ($Sc_2O_3$), lanthanum oxide ($LaO_3$), cerium oxide ($CeO_2$), praseodymium oxide ($Pr_6O_{11}$), neodymium oxide ($Nd_2O_3$), promethium oxide ($Pm_2O_3$), samarium oxide ($Sm_2O_3$), europium oxide ($Eu_2O_3$), gadolinium oxide. ($Gd_2O_3$), terbium oxide ($Tb_4O_7$), dysprosium oxide ($Dy_2O_3$), holmium oxide ($Ho_2O_3$), erbium oxide ($Er_2O_3$), thulium oxide ($Tm_2O_3$), ytterbium oxide ($YB_2O_3$) and lutetium oxide ($Lu_2O_3$) may be exemplified, but the present invention does not comprise rare-earth metal oxides that contain only one rare-earth metal as a dopant.

Meanwhile, previously, the dopant was described as containing one or more of magnesium oxide, yttria, graphene, and the remaining rare-earth metal oxides excluding yttria. However, it is better for the present invention to basically include magnesium oxide as a dopant. Also, it is preferable to use magnesium oxide and graphene together as a dopant. Also, it is more preferable to use magnesium oxide, graphene, and yttria together as a dopant. Also, it is most preferable to use magnesium oxide, graphene, yttria, and rare earth complex oxides together as a dopant.

If magnesium oxide and graphene are used together as a dopant, the magnesium oxide may be comprised in an amount of 0.05 to 0.5 parts by weight, and the graphene may be comprised in an amount of 0.05 to 0.5 parts by weight, based on the total weight of 100 parts by weight of alumina and aluminum nitride.

In addition, if magnesium oxide, graphene, and yttria are used together as a dopant, the magnesium oxide may be comprised in an amount of 0.05 to 0.5 parts by weight, the graphene may be comprised in an amount of 0.05 to 0.5 parts by weight, and the yttria may be comprised in an amount of 0.05 to 0.5 parts by weight, based on the total weight of 100 parts by weight of alumina and aluminum nitride.

In addition, if magnesium oxide, graphene, yttria and rare earth complex oxides are used together as a dopant, the magnesium oxide may be comprised in an amount of 0.05 to 0.5 parts by weight, the graphene may be comprised in an amount of 0.05 to 0.5 parts by weight, the yttria may be comprised in an amount of 0.05 to 0.5 parts by weight, and the rare earth complex oxides may be comprised in an amount of 0.05 to 0.5 parts by weight, based on the total weight of 100 parts by weight of alumina and aluminum nitride.

Hereinafter, the plasma resistance hybrid coating layer formed on the ceramic plate layer of the ceramic susceptor according to the first embodiment of the present invention described above will be described in detail.

The ceramic susceptor according to the first embodiment of the present invention can stabilize the coating interface by forming a coating layer on the ceramic plate layer used as a sintered body in such a way that a reaction layer is formed by reactive sintering at the interface between the ceramic plate layer and the coating layer, thereby reducing stress due to microstructure and differences in physical properties such as thermal expansion coefficient between the ceramic plate layer and the coating layer.

Specifically, the ceramic susceptor according to the first embodiment of the present invention comprises a coating layer located on the ceramic plate layer, wherein the coating layer may comprise a first coating layer formed on the ceramic plate layer; and a reaction layer formed at the interface between the ceramic plate layer and the first coating layer.

According to the prior art, yttria or Y-based compounds were coated on the AlN or $Al_2O_3$ ceramic plate, but after coating, peeling phenomenon occurred at the interface due to stress due to microstructure and differences in physical properties such as thermal expansion coefficient and in particular, there was a problem that in high temperature environments of 500° C. or higher, the peeling phenomenon of the coating becomes more noticeable.

However, the present inventors found that if a Y (yttrium)-based compound is coated on a ceramic plate containing AlN and $Al_2O_3$ using a hot press sintering method to form a coating layer, a reaction layer is created at the interface between the ceramic plate layer and the coating layer by reactive sintering, which has the effect of increasing hardness and density as well as densification. This reaction layer is created by reactive sintering through high-temperature and high-pressure energy, stabilizes the microstructure of the interface between the ceramic plate layer and the coating layer, and relieves stress caused by differences in physical properties, such as thermal expansion coefficient, between the different materials constituting the ceramic plate layer and the coating layer, thereby allowing the coating layer to be stably maintained without peeling of the even in a high temperature environment of 500° C. or higher.

More specifically, the ceramic susceptor according to the first embodiment of the present invention includes a first coating layer formed by sintering a coating material, which comprises one or more of $Y_2O_3$, $YF_3$, YOF, YAG, YAS, YAM and YAP, on the ceramic plate layer using a hot press method. In this case, a reaction layer is formed at the interface between the ceramic plate layer and the coating material by reactive sintering the material of the ceramic plate layer and the material of the coating layer. That is, the yttrium component contained in the material of the coating layer can be reacted and sintered with the aluminum or alumina component present in the ceramic plate layer to form a YAG reaction layer containing one or more of YAG, YAM, and YAP, and in the first embodiment of the present invention, this is defined as a reaction layer.

In this case, in order to create a more stable reaction layer, it is preferable to essentially include yttria ($Y_2O_3$) as the material of the coating layer, but the present invention is not limited thereto, and even when the coating material contains one or more of the Y-based compounds ($YF_3$, YOF, YAG, YAS, YAM and YAP) other than yttria, or the coating material contains two or more Y-based compounds including yttria, the yttrium component contained in the Y-based compound can be also reacted and sintered with the aluminum or alumina component present in the ceramic plate layer to form a reaction layer containing one or more of YAG, YAM, and YAP Accordingly, in the ceramic susceptor according to the first embodiment of the present invention, the first coating layer may contain one or more of $Y_2O_3$, $YF_3$, YOF, YAG, YAS, YAM, and YAP, and a reaction layer generated by reactive sintering is formed at the interface between the ceramic plate layer and the first coating layer, wherein the reaction layer may contain one or more of YAG, YAM, and YAP. In this case, the first coating layer is manufactured by hot press sintering, and its thickness, including the reaction layer, can be formed to be 10 to 200 μm.

In the ceramic susceptor according to the first embodiment of the present invention, the first coating layer may contain one or more compounds selected from the group consisting of $Y_2O_3$, $YF_3$, YOF, YAG, YAS, YAM, and YAP, wherein these compounds are defined as Y compounds in the specification of the present invention.

Among the Y compounds, $Y_2O_3$ is expressed as yttrium oxide and is also called yttria. $YF_3$ refers to yttrium fluoride, and the YOF is a YOF-based compound and may refer to one or more types selected from $Y_5O_4F_7$, $Y_6O_5F_8$, $Y_7O_6F_9$ and $Y_{17}O_{14}F_{23}$. The YAG represents yttrium aluminum garnet (YAG, $Y_3Al_5O_{12}$), and the YAS represents yttria-alumina-silica (YAS, yttrium aluminosilicate, $Y_2O_3$—$Al_2O_3$—$SiO_2$). The YAM represents yttrium-aluminum monoclinic (YAM, $Y_4Al_2O_9$), and the YAP represents yttrium-aluminum perovskite (YAP, $YAlO_3$).

In the ceramic susceptor according to the first embodiment of the present invention, the coating layer may be formed by forming a first coating layer and a reaction layer produced by hot pressing on a ceramic plate layer, and then forming a second coating layer composed of Y compound again on the first coating layer, in order to further improve the plasma resistance and particle resistance.

In this case, the second coating layer contains one or more of $Y_2O_3$, $YF_3$, YOF, YAG, YAS, YAM, and YAP, and may be formed on the first coating layer by a sputtering process. That is, the second coating layer is formed by generating plasma at a relatively low degree of vacuum and accelerating an inert gas such as ionized argon (Ar) gas to collide with a target containing one or more of the $Y_2O_3$, $YF_3$, YOF, YAG, YAS, YAM and YAP, and thus depositing particles of atoms containing one or more of $Y_2O_3$, $YF_3$, YOF, YAG, YAS, YAM, and YAP on the first coating layer.

The second coating layer obtained in this way is composed of a material having the same or similar physical properties as the material constituting the first coating layer, and thus shows a very high bonding strength with the first coating layer, and not only forms an excellent joint surface, but can also significantly reduce the porosity of the surface of the coating layer, and thus has the advantage of further improving the plasma resistance and particle resistance due to an improvement in the degree of densification of the coating layer.

The second coating layer as described above contains one or more of $Y_2O_3$, $YF_3$, YOF, YAG, YAS, YAM, and YAP, and is formed on the first coating layer by a sputtering process, and its thickness may be 0.1 to 5 μm, and of course, it may be formed by various deposition processes in addition to the sputtering process.

As reviewed above, the ceramic susceptor according to the first embodiment of the present invention is a ceramic susceptor comprising a ceramic plate layer and a first coating layer located on the ceramic plate layer, wherein the ceramic plate layer contains alumina ($Al_2O_3$) and aluminum nitride (AlN) and does not contain an aluminum oxynitride phase (AlON phase) and it comprises a reaction layer formed at the interface between the ceramic plate layer and the first coating layer by reactive sintering. Here, the first coating layer is formed by a hot press method, and a second coating layer may be further included on the first coating layer to further improve the plasma resistance and particle resistance, and the coating layer is characterized by being formed by a sputtering process.

Since the first coating layer is created by placing one or more coating materials among $Y_2O_3$, $YF_3$, YOF, YAG, YAS, YAM, and YAP on the ceramic plate layer and then sintering it by hot pressing, as the alumina or aluminum component contained in the ceramic plate layer (base material) reacts with the yttrium (Y) element of the coating material, which is one or more of $Y_2O_3$, $YF_3$, YOF, YAG, YAS, YAM and YAP, a reaction layer is created at the interface between the ceramic plate layer and the first coating layer by reactive sintering of yttrium and aluminum, and accordingly, the reaction layer contains one or more of YAG, YAM, and YAP. The inventors of the present invention found that the coating layer produced in this way has the effect of increasing hardness and density as well as densification of the coating layer. Through this high temperature and high-pressure energy, the microstructure of the interface between the ceramic plate and the Y compound of the coating layer may be stabilized.

The second coating layer may be created by a sputtering process on the first coating layer, and may contain one or more of $Y_2O_3$, $YF_3$, YOF, YAG, YAS, YAM, and YAP. As the second coating layer is created on the first coating layer made of Y compound, it can increase resistance to deformation or destruction due to differences in physical properties between the base material and the coating layer. In addition, as the coating of Y compound progresses, a particle reduction effect can be expected due to an increase in plasma resistance.

Next, a method of manufacturing a ceramic susceptor according to the present invention will be described.

First, the method of manufacturing the ceramic susceptor according to the first embodiment comprises the steps of 1) manufacturing a ceramic plate layer; and 2) forming a coating layer on the ceramic plate layer.

First, step 1) of manufacturing a ceramic plate layer comprises the steps of a) mixing alumina ($Al_2O_3$), aluminum nitride (AlN), an alcohol compound and a binder, b) drying the mixture to prepare a powder from which the alcohol compound component is removed, c) compressing and molding the dried powder to produce a pre-formed body processed into a certain shape, d) removing the binder component by degreasing the prepared pre-formed body and e) sintering and polishing the degreased pre-formed body.

In addition, if necessary, a dopant can be added and mixed in step a), and as such a dopant, one or more of magnesium oxide (MgO), yttria ($Y_2O_3$), graphene, and rare earth complex oxides may be exemplified.

The alcohol compound used in the step a) is used to properly mix the raw materials, and may comprise, for example, alcohol compounds having 1 to 5 carbon atoms, specifically ethanol, methanol, and isopropyl alcohol. Likewise, the binder used in step a) is to improve the bonding strength of the raw materials, and may comprise, for example, polyvinyl alcohol (PVA) and polyvinyl butyral (PVB).

The step b) is a step of drying the powder mixture mixed in the step a) to remove the alcohol component. The drying can be performed by methods known in the art, such as spray drying and vacuum drying, and the drying time can be variously applied depending on the physical properties of the intended ceramic plate layer.

The step c) is a step of compressing and molding the dried powder to produce a pre-formed body processed into a certain shape. The compression molding is the first molding process to control the powder dried in the step b) into the desired size and shape, and the press molding, etc. may be exemplified. At this time, in order to manufacture products with more dense specifications, cold isostatic pressing (CIP) can be additionally performed as needed. The press molding is preferably performed at room temperature and in a general atmosphere, but is not limited thereto, and the atmosphere during molding is good as long as it does not affect the molding of the mixture. In addition, after the molding process in step c) is performed, a pre-formed body can be manufactured by performing processing using a green processing (performed before sintering, also called raw processing) method, etc.

The step d) is a step of removing the binder component by degreasing the prepared pre-formed body. The degreasing is a process for removing binders and contaminants with oily properties, and can be performed at a temperature of 350 to 600° C. within 60 hours.

The step e) is a step of manufacturing a ceramic substrate by sintering (second molding) and polishing the degreased pre-formed body. The sintering is a second molding process to further improve the volumetric resistance rate of the ceramic plate layer, and it is preferable to use a hot press sintering method. In addition, if the degreased pre-formed body is sintered at a temperature of 1,650° C. or higher, alumina and aluminum nitride react to form an AlON phase, which causes the problem of lowering the thermal conductivity. Therefore, the sintering in the step e) must be performed at a temperature less than 1,650° C., preferably a temperature of 1,300° C. or more and less than 1,650° C.

Next, step 2) of forming a coating layer on the ceramic plate layer comprises the steps of a) preparing a coating solution containing a plasma resistance material, b) spraying the prepared coating solution onto the ceramic plate layer prepared according to the step 1), and c) drying the sprayed coating solution and then hot pressing it to form a first coating layer.

The plasma resistance material in the step a) may contain one or more of $Y_2O_3$, $YF_3$, YOF, YAG, YAS, YAM, and YAP as the Y compound previously described in the coating layer, and the coating solution can be prepared by mixing the Y compound and a solvent such as ethanol at a predetermined speed for a predetermined time using a mixer.

The spraying of the coating solution in the step b) may be performed by spraying the mixed coating solution onto the ceramic plate layer using an air spray, but this is not limited to this, and of course, all known spraying methods for forming a coating layer can be used.

The drying in the step c) can be performed at room temperature for 10 minutes, and the hot pressing can be performed at a temperature of 1300 to less than 1650° C. and a pressure of 100 to 200 bar for 1 to 24 hours. Here, through the hot press process, as previously reviewed, a reaction layer is formed by reactive sintering of the yttrium component contained in the first coating layer and the aluminum or alumina component contained on the ceramic plate layer, at the interface between the ceramic plate layer and the first coating layer.

In addition, after the step c), in order to further improve the plasma resistance and particle resistance of the coating layer, step of e) forming a second coating layer by additionally coating the plasma resistance material on the first coating layer may be further included. The coating in the step e) can be used without particular limitations as long as it is a method that can coat a plasma resistance material, and preferably, the coating can be performed through spraying or sputtering.

The ceramic susceptor of the present invention manufactured through the above manufacturing method can be applied to various devices or members for the semiconductor manufacturing process, and among them, it is preferable to apply it as a material for heaters or electrostatic chucks for the semiconductor manufacturing process. However, there are no particular restrictions on its field of application, such as it can be used in fields that use ceramic materials in a high-temperature plasma environment.

Hereinafter, the present invention will be described in more detail through specific examples. The following examples are intended to illustrate the present invention, and the present invention is not limited by the following examples.

[Manufacturing Examples 1 to 7] Manufacturing of Ceramic Plate Layer and Evaluation of Physical Properties For the purpose of deriving the optimal mixing ratio of alumina and aluminum nitride, the raw materials were mixed in the ratio shown in Table 1 below, and additionally, a small amount of ethanol and polyvinyl butyral (binder) were mixed and dried. Subsequently, the dried mixture was press molded and processed to prepare a pre-formed body. Then, after degreasing at a temperature of 500° C. for 30 hours, the degreased pre-formed body was sintered in a high-temperature pressurized sintering furnace (pressure of 250 bar, temperature of 1,630° C.) and polished to manufacture a ceramic plate layer.

In addition, the volumetric resistance rate and thermal conductivity of each manufactured ceramic susceptor were measured. Specifically, the current was measured 1 minute later (measured under vacuum atmosphere and room temperature) to calculate the volumetric resistance rate. In addition, specimens were manufactured according to the specifications of ASTM C0408-88R11 using LFA 467 equipment by NETZSCH company, and then thermal conductivity was calculated by measuring at room temperature. The results are shown in Table 2 below.

TABLE 1

| | $Al_2O_3$:AlN (weight ratio) |
|---|---|
| Manufacturing Example 1 | 100:0 |
| Manufacturing Example 2 | 99.8:0.2 |
| Manufacturing Example 3 | 95:5 |
| Manufacturing Example 4 | 85:15 |
| Manufacturing Example 5 | 75:25 |
| Manufacturing Example 6 | 68:32 |
| Manufacturing Example 7 | 60:40 |

TABLE 2

| | Volumetric resistance rate (@ 500° C., $\Omega \cdot cm$) | Thermal conductivity (@ room temperature, W/m·k) | Density (g/cm³) | Hardness (Gpa) | XRD result (% by weight) $Al_2O_3$ | AlN |
|---|---|---|---|---|---|---|
| Manufacturing Example 1 | 1.6E+13 | 23.2 | 3.957 | 17.2 | 100 | 0 |
| Manufacturing Example 2 | 1.1E+13 | 28.4 | 3.959 | 17.1 | 99.5 | 0.5 |
| Manufacturing Example 3 | 3.3E+11 | 31.7 | 3.896 | 16.5 | 94.7 | 5.3 |
| Manufacturing Example 4 | 8.8E+10 | 33.2 | 3.801 | 15.1 | 83.8 | 16.2 |
| Manufacturing Example 5 | 3.0E+10 | 35.1 | 3.755 | 14.7 | 76.1 | 23.9 |
| Manufacturing Example 6 | 9.8E+09 | 36.3 | 3.696 | 14.2 | 67.1 | 32.9 |
| Manufacturing Example 7 | 5.3E+08 | 42.1 | 3.625 | 13.6 | 59.7 | 40.3 |

*$Al_2O_3$ and AlN unit: % by weight

As can be seen from Tables 1 and 2 above, the ratio of aluminum nitride is also changed depending on the addition ratio of aluminum nitride, and thus, the volumetric resistance at high temperature and the thermal conductivity at room temperature are changed.

More specifically, the change in physical properties according to the addition ratio of aluminum nitride was confirmed, and as can be seen from the XRD results, the AlON phase was not generated in all of the final products of Manufacturing Examples 1 to 7. In addition, Manufacturing Examples 3 to 5 showed satisfactory results in both the volumetric resistance rate and the thermal conductivity, and Manufacturing Example 5, in which alumina and aluminum nitride were mixed at a weight ratio of 75:25, was the best overall.

Through this, if the content of aluminum nitride is too small, the $Al_2O_3$ phase is formed as the main phase, so there is little effect of improving thermal conductivity, and if the content of aluminum nitride is excessive, the ratio of the AlN phase is increased, and thus there is an effect of improving thermal conductivity, but the volumetric resistance and the hardness tend to decrease.

[Manufacturing Examples 5-1 to 5-5] Evaluation of Physical Properties of Ceramic Plate Layer Depending on Sintering Temperature Based on the results showing that Manufacturing Example 5, in which alumina and aluminum nitride were mixed at a weight ratio of 75:25, was the best overall, ceramic plate layers were manufactured while only setting the sintering temperature differently, as shown in Table 3 below (same as the manufacturing method in Manufacturing Example 1 above, except for composition and sintering temperature).

In addition, the volumetric resistance and thermal conductivity were measured for each manufactured ceramic plate layer. Specifically, the current was measured 1 minute later (measured under vacuum atmosphere and room temperature) to calculate the volumetric resistance rate. In addition, specimens were manufactured according to the specifications of ASTM C0408-88R11 using LFA 467 equipment by NETZSCH company, and then thermal conductivity was calculated by measuring at room temperature. The results are shown in Table 4 below.

TABLE 3

| | $Al_2O_3$:AlN (weight ratio) | Sintering temperature (° C.) |
|---|---|---|
| Manufacturing Example 5-1 | 75:25 | 1,500 |
| Manufacturing Example 5-2 | 75:25 | 1,550 |
| Manufacturing Example 5-3 | 75:25 | 1,630 |
| Manufacturing Example 5-4 | 75:25 | 1,650 |
| Manufacturing Example 5-5 | 75:25 | 1,700 |

TABLE 4

|  | Volumetric resistance rate (@ 500° C., Ω·cm) | Thermal conductivity (@ room temperature, W/m·k) | Density (g/cm³) | Hardness (Gpa) | XRD result (% by weight) | | |
|---|---|---|---|---|---|---|---|
|  |  |  |  |  | $Al_2O_3$ | AlN | AlON |
| Manufacturing Example 5-1 | not measurable | 18.1 | 3.423 | 13.2 | 74.8 | 25.2 | 0 |
| Manufacturing Example 5-2 | 9.9E+09 | 32.2 | 3.718 | 14.4 | 75.4 | 24.6 | 0 |
| Manufacturing Example 5-3 | 3.0E+10 | 35.1 | 3.755 | 14.7 | 76.1 | 23.9 | 0 |
| Manufacturing Example 5-4 | 4.4E+11 | 24.8 | 3.765 | 15.1 | 71.1 | 23.8 | 5.1 |
| Manufacturing Example 5-5 | 6.2E+11 | 19.4 | 3.775 | 16.5 | 58.2 | 17.3 | 24.5 |

*$Al_2O_3$, AlN and AlON unit: % by weight

Figure 2:
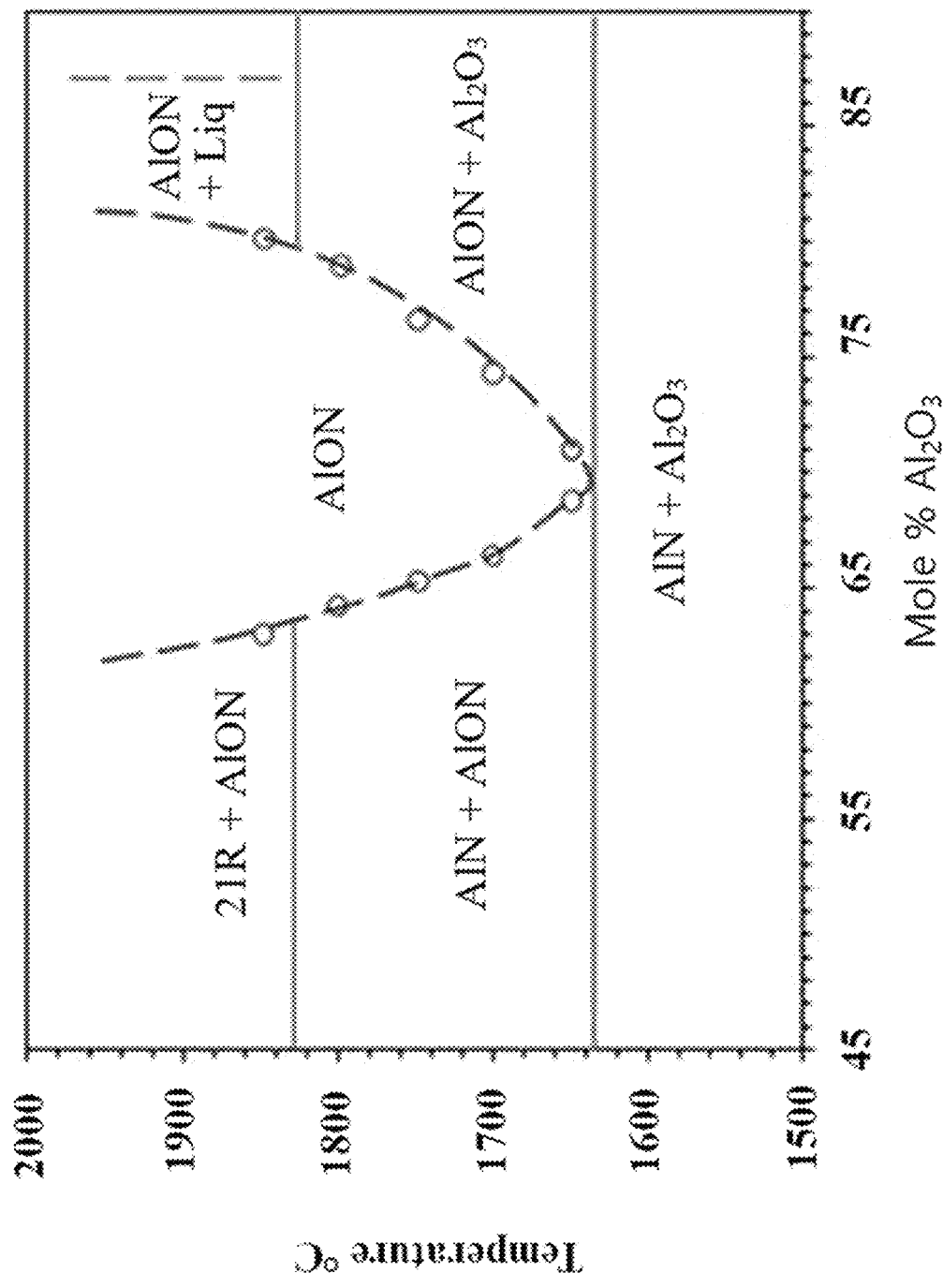
FIG. 2 is a graph showing the correlation between the alumina content and the sintering temperature.

Alumina reacts with aluminum nitride above a certain temperature to form AlON phase. Although the AlON phase has high electrical insulating properties, since its thermal conductivity is low, the presence or absence of the AlON phase has a significant impact on the physical properties. FIG. 1 is an XRD graph showing the physical properties of the ceramic susceptor depending on the sintering temperature, and FIG. 2 is a graph showing the correlation between the alumina content and the sintering temperature. Referring to FIGS. 1 and 2, at a sintering temperature of 1,500° C., non-sintering occurred, making the measurement of the volumetric resistance impossible, and the thermal conductivity and density were measured to be very low. As a result of the analysis of the XRD graph, the AlON phase was generated at a sintering temperature of less than 1, 650° C., and as the AlON content is increased, the volumetric resistance is increased, but the thermal conductivity tended to decrease rapidly. Therefore, it can be seen that the sintering in the present invention is preferably performed at a temperature of less than 1,650° C.

[Manufacturing Examples 8 to 19, Comparative Manufacturing Examples 8 to 19] Manufacturing of Ceramic Plate Layer Considering the experimental results of Manufacturing Example 5-3, the raw materials were mixed according to the composition in Table 5 below, and a small amount of ethanol and polyvinyl butyral (binder) were additionally mixed and then dried. Subsequently, the dried mixture was press molded and processed to prepare a pre-formed body. Then, after degreasing at a temperature of 500° C. for 30 hours, the degreased pre-formed body was sintered in a high-temperature pressurized sintering furnace (pressure of 250 bar, temperature of 1,630° C.) and polished to manufacture a ceramic plate layer.

TABLE 5

|  | $Al_2O_3$: AlN (weight ratio) | Dopant | | | |
|---|---|---|---|---|---|
|  |  | MgO | GNP (Graphene nano powder) | Nano $Y_2O_3$ | Rare earth complex oxide |
| Manufacturing Example 8 | 75:25 | 0.05 |  |  |  |
| Manufacturing Example 9 | 75:25 | 0.1 |  |  |  |
| Manufacturing Example 10 | 75:25 | 0.5 |  |  |  |
| Manufacturing Example 11 | 75:25 | 0.1 | 0.05 |  |  |
| Manufacturing Example 12 | 75:25 | 0.1 | 0.1 |  |  |
| Manufacturing Example 13 | 75:25 | 0.1 | 0.5 |  |  |
| Manufacturing Example 14 | 75:25 | 0.1 | 0.1 | 0.05 |  |
| Manufacturing Example 15 | 75:25 | 0.1 | 0.1 | 0.1 |  |
| Manufacturing Example 16 | 75:25 | 0.1 | 0.1 | 0.5 |  |
| Manufacturing Example 17 | 75:25 | 0.1 | 0.1 | 0.1 | 0.05 |
| Manufacturing Example 18 | 75:25 | 0.1 | 0.1 | 0.1 | 0.1 |
| Manufacturing Example 19 | 75:25 | 0.1 | 0.1 | 0.1 | 0.5 |
| Comparative Manufacturing Example 8 | 75:25 | 0.01 |  |  |  |
| Comparative Manufacturing Example 9 | 75:25 | 1 |  |  |  |
| Comparative Manufacturing Example 10 | 75:25 | 3 |  |  |  |
| Comparative Manufacturing Example 11 | 75:25 | 0.1 | 0.01 |  |  |
| Comparative Manufacturing Example 12 | 75:25 | 0.1 | 1 |  |  |
| Comparative Manufacturing Example 13 | 75:25 | 0.1 | 3 |  |  |
| Comparative Manufacturing Example 14 | 75:25 | 0.1 | 0.1 | 0.01 |  |

TABLE 5-continued

| | Al$_2$O$_3$: AlN (weight ratio) | Dopant | | | |
|---|---|---|---|---|---|
| | | MgO | GNP (Graphene nano powder) | Nano Y$_2$O$_3$ | Rare earth complex oxide |
| Comparative Manufacturing Example 15 | 75:25 | 0.1 | 0.1 | 1 | |
| Comparative Manufacturing Example 16 | 75:25 | 0.1 | 0.1 | 3 | |
| Comparative Manufacturing Example 17 | 75:25 | 0.1 | 0.1 | 0.1 | 0.01 |
| Comparative Manufacturing Example 18 | 75:25 | 0.1 | 0.1 | 0.1 | 1 |
| Comparative Manufacturing Example 19 | 75:25 | 0.1 | 0.1 | 0.1 | 3 |

\* dopant unit: % by weight

[Experiment Example 1] Evaluation of Volumetric Resistance and Thermal Conductivity of Ceramic Susceptor A voltage of 500 V/mm was applied to each ceramic susceptor manufactured from Manufacturing Examples 8 to 19 and Comparative Manufacturing Examples 8 to 19, and then after 1 minute, the current was measured (measured in a vacuum atmosphere and at room temperature) to calculate the volumetric resistance rate, and the results are shown in Table 6 below.

In addition, specimens were manufactured for each ceramic plate layer manufactured from Manufacturing Examples 8 to 19 and Comparative Manufacturing Examples 8 to 19 using the LFA 467 equipment by NETZSCH company in accordance with the specifications of ASTM C0408-88R11, and then the thermal conductivity was calculated by measuring at room temperature, and the results are also shown in Table 6 below.

In addition, the density value of each ceramic plate layer manufactured from Manufacturing Examples 8 to 19 and Comparative Manufacturing Examples 8 to 19 was calculated using the Archimedes method, and the results are also shown in Table 6 below.

TABLE 6

| | Volumetric resistance rate (@ 500° C., Ω·cm) | Thermal conductivity (@ room temperature, W/m·k) | Density (g/cm$^3$) | Hardness (Gpa) |
|---|---|---|---|---|
| Manufacturing Example 8 | 4.0E+10 | 36.9 | 3.755 | 15.4 |
| Manufacturing Example 9 | 5.1E+10 | 37.1 | 3.751 | 15.2 |
| Manufacturing Example 10 | 8.3E+10 | 37.3 | 3.757 | 15.8 |
| Manufacturing Example 11 | 4.9E+10 | 40.2 | 3.750 | 15.4 |
| Manufacturing Example 12 | 4.4E+10 | 41.8 | 3.742 | 15.3 |
| Manufacturing Example 13 | 4.3E+10 | 42.6 | 3.707 | 15.1 |
| Manufacturing Example 14 | 4.5E+10 | 43.0 | 3.745 | 16.1 |
| Manufacturing Example 15 | 7.0E+10 | 44.4 | 3.742 | 16.3 |
| Manufacturing Example 16 | 8.1E+10 | 49.1 | 3.756 | 16.9 |
| Manufacturing Example 17 | 7.1E+10 | 45.3 | 3.751 | 16.5 |
| Manufacturing Example 18 | 9.5E+10 | 50.7 | 3.767 | 16.8 |
| Manufacturing Example 19 | 7.4E+10 | 50.2 | 3.774 | 16.5 |
| Comparative Manufacturing Example 8 | 3.2E+10 | 36.2 | 3.752 | 15.1 |
| Comparative Manufacturing Example 9 | 1.2E+11 | 24.1 | 3.761 | 16.3 |
| Comparative Manufacturing Example 10 | 2.7E+11 | 17.7 | 3.788 | 15.9 |
| Comparative Manufacturing Example 11 | 5.3E+10 | 37.2 | 3.748 | 15.3 |
| Comparative Manufacturing Example 12 | 2.9E+08 | 24.2 | 3.608 | 13.8 |
| Comparative Manufacturing Example 13 | 1.7E+07 | 18.4 | 3.489 | 11.2 |
| Comparative Manufacturing Example 14 | 1.4E+10 | 38.8 | 3.733 | 15.7 |
| Comparative Manufacturing Example 15 | 6.2E+09 | 37.0 | 3.764 | 17.2 |
| Comparative Manufacturing Example 16 | 8.8E+07 | 28.5 | 3.761 | 16.8 |
| Comparative Manufacturing Example 17 | 6.2E+10 | 39.1 | 3.732 | 16.3 |
| Comparative Manufacturing Example 18 | 2.8E+09 | 37.1 | 3.781 | 17.1 |
| Comparative Manufacturing Example 19 | 7.2E+07 | 22.9 | 3.795 | 17.1 |

As a result of measuring the volumetric resistance rate and thermal conductivity of each ceramic plate layer manufactured in Manufacturing Examples 8 to 19 and Comparative Manufacturing Examples 8 to 19, all ceramic plate layers of Manufacturing Examples 8 to 19 satisfied the volumetric resistance (1.0E+10Ω·cm to 1.0E+13Ω·cm) at 500° C. required by the next-generation semiconductor manufacturing process, as shown in Table 6.

Also, in the case of the thermal conductivity, as can be seen by comparing Manufacturing Examples 8 to 10 with Comparative Manufacturing Examples 8 to 10, Manufacturing Examples 11 to 13 with Comparative Manufacturing Examples 11 to 13, Manufacturing Examples 14 to 16 with Comparative Manufacturing Examples 14 to 16, and Manufacturing Examples 17 to 19 with Comparative Manufacturing Examples 17 to 19, Manufacturing Examples 8 to 19, in which each dopant was used in an amount of 0.05 to 0.5% by weight, were superior to Comparative Manufacturing Examples 8 to 19 in which at least one dopant was used outside the range of 0.05 to 0.5% by weight.

Meanwhile, when GNP (graphene nano-powder) was added in addition to MgO as a dopant, the effect was not significant when GNP was used at less than 0.05% by weight, and the thermal conductivity was improved when used at 0.05 to 0.5% by weight. In addition, when GNP was used in an amount exceeding 0.5% by weight, the volumetric resistance, the density, and the hardness tended to rapidly decrease.

In addition, even when nano-sized yttria (Y$_2$O$_3$) was added in addition to MgO and GNP as a dopant, when used at 0.05 to 0.5% by weight, sintering properties were increased, and thus the effect of increasing the volumetric resistance and thermal conductivity was seen. However, when yttria was used in an amount exceeding 0.5% by weight, secondary phases such as YAP, YAM, and YAG were formed in large quantities due to reaction with alumina, and the thermal conductivity tended to decrease.

In addition, even when rare earth complex oxides were added in addition to MgO, GNP and nano-sized yttria (Y 03) as a dopant, when used at 0.05 to 0.5% by weight, it was confirmed that not only did the volumetric resistance and thermal conductivity tend to increase, but the density and hardness were also increased. On the other hand, when rare earth complex oxides were used in amounts exceeding 0.5% by weight, both the volumetric resistance and thermal conductivity tended to decrease rapidly.

In addition, comparing Manufacturing Example 9 and Comparative Manufacturing Example 9, since Manufacturing Example 9 used MgO at 0.5% by weight and Comparative Manufacturing Example 9 used MgO at 1% by weight, even though the difference in content is not significant, the thermal conductivity was rapidly decreased while the MgO content was increased from 0.5% by weight to 18 by weight. This is due to the fact that if the amount of MgO used exceeds 0.5% by weight, the $MgAl_2O_4$ phase or MgAlON phase is generated in excess exceeding 0.6% by weight in the final product, and thus the fraction is increased. These results can be confirmed through Table 7 below.

TABLE 7

| | $Al_2O_3$: AlN (weight ratio) | Dopant MgO | XRD result (% by weight) | | |
|---|---|---|---|---|---|
| | | | $Al_2O_3$ | AlN | $MgAl_2O_4$ or MgAlON |
| Manufacturing Example 8 | 75:25 | 0.05 | 75.1 | 24.9 | 0 |
| Manufacturing Example 9 | 75:25 | 0.1 | 75.0 | 24.8 | 0.2 |
| Manufacturing Example 10 | 75:25 | 0.5 | 74.8 | 24.6 | 0.6 |
| Comparative Manufacturing Example 8 | 75:25 | 0.01 | 74.8 | 25.2 | 0 |
| Comparative Manufacturing Example 9 | 75:25 | 1 | 74.6 | 24.1 | 1.3 |
| Comparative Manufacturing Example 10 | 75:25 | 3 | 73.4 | 23.8 | 2.8 |

* dopant unit: % by weight

[Examples 1 to 5, Comparative Examples 1 to 6] Manufacturing of Ceramic Susceptor Ceramic susceptors were manufactured as shown in Table 8 below.

In the case of Examples 1 to 5, Comparative Example 3, and Comparative Example 6, the ceramic plate layer manufactured in Manufacturing Example 18 of Table 5 was used as a ceramic plate layer.

In the case of Comparative Example 1, Comparative Example 2, Comparative Example 4 and Comparative Example 5, the ceramic plate layer was manufactured in the same manner as Manufacturing Example 18 in Table 5 above, except that the ceramic plate layer was manufactured using a single material shown in Table 8 below, and then it was used as a ceramic susceptor without a separate coating layer.

In the case of Comparative Example 6 and Examples 1 to 5, a ceramic susceptor was manufactured by forming a coating layer on the ceramic plate layer manufactured previously in Manufacturing Example 18 of Table 5 in the following manner.

TABLE 8

| | Ceramic plate layer | First coating layer | Second coating layer | Coating method |
|---|---|---|---|---|
| Comparative Example 1 | AlN | — | — | — |
| Comparative Example 2 | $Al_2O_3$ | — | — | — |
| Comparative Example 3 | Manufacturing Example 18 | — | — | — |
| Comparative Example 4 | $Y_2O_3$ | — | — | — |
| Comparative Example 5 | YAG | — | — | — |
| Comparative Example 6 | Manufacturing Example 18 | $Y_2O_3$ | — | SPS/AD coating |
| Example 1 | Manufacturing Example 18 | $Y_2O_3$ | — | hot pressing |
| Example 2 | Manufacturing Example 18 | 50% $Y_2O_3$ + 50% YAG | — | hot pressing |
| Example 3 | Manufacturing Example 18 | 45% $Y_2O_3$ + 55% YAG | — | hot pressing |
| Example 4 | Manufacturing Example 18 | 40% $Y_2O_3$ + 60% YAG | — | hot pressing |
| Example 5 | Manufacturing Example 18 | $Y_2O_3$ | $YF_3$ | hot pressing + sputtering |

First, the first coating layer of Comparative Example 6 was formed through a suspension plasma spray (SPS) or aerosol deposition (AD) process, and yttria ($Y_2O_3$) was used as a material for the coating layer.

The suspension plasma spray coating and aerosol deposition coating method are well known as conventional coating methods for ceramic materials and thus detailed description thereof will be omitted. However, in the process for forming the first coating layer in this Comparative Example 6, sand blasting was performed to improve the adhesion of the coating powder ($Y_2O_3$ powder in this Comparative Example) to the surface of the ceramic plate layer, and in order to reduce the occurrence of thermal stress during the process, the ceramic plate layer was preheated 2 to 3 times at a temperature between 70° C. or more and 100° C. or less. In addition, the plasma source gas was used at a ratio of Ar:He=70:30, and the current applied between the positive electrode and the negative electrode was set to flow at 500A.

In the case of the first coating layer in Example 1, a coating solution was prepared by first mixing a solution of $Y_2O_3$: ethanol at a weight ratio of 40:60 with an ARE-501 mixer by Thinky company at a speed of 1200 rpm for 1 hour. The mixed coating solution was sprayed on the ceramic plate layer using an air spray, dried at room temperature for 10 minutes, and then hot pressed under the conditions of 1630° C. and a pressure of 200 bar. As a result, a coating layer with a thickness of 100 μm or more and 300 μm or less was formed before hot pressing and a coating layer with a thickness of 120 μm including the reaction layer was formed after hot pressing.

In the case of the first coating layer in Example 2, a primary coating solution was prepared by first mixing a solution of $Y_2O_3$: ethanol at a weight ratio of 40:60 with an ARE-501 mixer by Thinky company at a speed of 1200 rpm for 30 minutes, and secondary, a solution containing YAG: ethanol at a weight ratio of 58:42 was mixed with the primary coating solution to have a weight ratio of $Y_2O_3$: YAG=50:50, and then mixed with the primary coating solution for 30 minutes at a speed of 1200 rpm in the same equipment to prepare a final coating solution with a weight ratio of $Y_2O_3$:YAG=50:50. The finished coating solution was sprayed on the ceramic plate layer using an air spray, dried at room temperature for 10 minutes, and then hot pressed under the conditions of 1630° C. and a pressure of 200 bar. A coating layer with a thickness of 100 μm or more to 300 μm or less was formed before hot pressing and a coating layer with a thickness of 120 μm including the reaction layer was formed after hot pressing.

In the case of the first coating layer in Example 3, a primary coating solution was prepared by first mixing a solution of $Y_2O_3$: ethanol at a weight ratio of 40:60 with an ARE-501 mixer by Thinky company at a speed of 1200 rpm for 30 minutes, and secondary, a solution containing YAG: ethanol at a weight ratio of 58:42 was mixed with the primary coating solution to have a weight ratio of Y 03:YAG=45:55, and then mixed with the primary coating solution for 30 minutes at a speed of 1200 rpm in the same equipment to prepare a final coating solution with a weight ratio of $Y_2O_3$:YAG=45:55. The finished coating solution was sprayed on the ceramic plate layer using an air spray, dried at room temperature for 10 minutes, and then hot pressed under the conditions of 1630° C. and a pressure of 200 bar. A coating layer with a thickness of 100 μm or more to 300 μm or less was formed before hot pressing and a coating layer with a thickness of 120 μm including the reaction layer was formed after hot pressing.

In the case of the first coating layer in Example 4, a primary coating solution was prepared by first mixing a solution of $Y_2O_3$: ethanol at a weight ratio of 40:60 with an ARE-501 mixer by Thinky company at a speed of 1200 rpm for 30 minutes, and secondary, a solution containing YAG: ethanol at a weight ratio of 58:42 was mixed with the primary coating solution to have a weight ratio of $Y_2O_3$: YAG=40:60, and then mixed with the primary coating solution for 30 minutes at a speed of 1200 rpm in the same equipment to prepare a final coating solution with a weight ratio of $Y_2O_3$:YAG=40:60. The finished coating solution was sprayed on the ceramic plate layer using an air spray, dried at room temperature for 10 minutes, and then hot pressed under the conditions of 1630° C. and a pressure of 200 bar. A coating layer with a thickness of 100 μm or more to 300 μm or less was formed before hot pressing and a coating layer with a thickness of 120 μm including the reaction layer was formed after hot pressing.

In the case of the first coating layer in Example 5, a coating solution was prepared by first mixing a solution of $Y_2O_3$: ethanol at a weight ratio of 40:60 with an ARE-501 mixer by Thinky company at a speed of 1200 rpm for 1 hour. The mixed coating solution was sprayed on the ceramic plate layer using an air spray, dried at room temperature for 10 minutes, and then hot pressed under the conditions of 1630° C. and a pressure of 200 bar. As a result, a coating layer with a thickness of 100 μm or more and 300 μm or less was formed before hot pressing and a coating layer with a thickness of 120 μm including the reaction layer was formed after hot pressing. Thereafter, the ceramic susceptor on which the first coating layer was formed was placed in a vacuum chamber where RF electrodes were placed, and then argon (Ar) gas, which is an inert gas, was injected, and a sputtering process was performed using yttrium fluoride ($YF_3$) as the target material to form a second coating layer of $YF_3$ with a thickness of 1 to 3 μm on the first coating layer.

[Experiment Example 2] Peeling Test of Coating Layer of Ceramic Susceptor

The ceramic susceptor manufactured according to Comparative Example 6, Example 1, and Example 5 above was heat treated at 500° C., which is the actual temperature for use, to test whether the coating layer peeled off at high temperatures, and surface photographs of the ceramic susceptor after coating and scanning electron microscope (SEM) images of the cross-section of the joint surface are shown in FIGS. 3 to 5, in which the results were divided into before and after heat treatment.

First, referring to FIG. 3, the ceramic susceptor manufactured according to Comparative Example 6 was obtained by forming an yttria coating layer (first coating layer) on the ceramic plate layer manufactured according to the first embodiment of the present invention through a suspension plasma spray or aerosol deposition process, which is a well-known existing ceramic coating method. In the case of the ceramic susceptor manufactured according to Comparative Example 6, it was confirmed that before heat treatment at 500° C., in the surface photograph, it appears that a stable coating layer was formed, but in the SEM image of the joint surface, it is observed that the joint surface was irregular and many pores were formed, and when the heat treatment is performed at 500° C., the coating layer peels off and cracks occur, and thus it cannot be used in a high temperature environment of 500° C., which is the actual temperature for use.

Next, referring to FIG. 4, in the case of the ceramic susceptor according to the present invention manufactured according to Example 1, it was confirmed that a stable coating layer is formed when considering the surface photograph and SEM image before heat treatment at 500° C., and that a reaction layer is formed at the interface between the first coating layer and the ceramic plate layer, forming a dense bonding structure. In addition, it was confirmed that even when heat treatment was performed at 500° C., the formation of a stable coating layer is maintained and the reaction layer formed at the interface between the first coating layer and the ceramic plate layer also maintains a dense bonding structure when considering the surface photograph and SEM image, and thus it was confirmed that the plasma resistance and particle resistance can be improved without peeling of the coating layer even in a high temperature environment of 500° C., which is the actual temperature for use.

Finally, referring to FIG. 5, in the case of the ceramic susceptor according to the present invention manufactured according to Example 5, it was confirmed that as with the ceramic susceptor manufactured according to Example 1 shown in FIG. 4 above, a stable coating layer is formed and maintained on both the surface photographs and SEM images before and after heat treatment at 500° C., and that it has a dense bonding structure resulting from the formation of the reaction layer. In addition, it was confirmed that in the case of Example 5, since a second coating layer of $YF_3$ was formed by a sputtering process on the first coating layer created by hot pressing, this forms an even and stable joint surface, and thus an additional coating layer of the Y compound is formed on the first coating layer using various conventional coating processes, and therefore, it can be used in a variety of ways to form a coating layer that can further improve the plasma resistance and particle resistance without peeling off the coating layer even in a high temperature environment of 500° C. or higher.

[Experiment Example 3] Plasma Resistance Test of Ceramic Susceptor

For the ceramic susceptor manufactured above, a plasma resistance test was performed at 20° C. In this case, the plasma resistance test was conducted under the conditions in Table 9 below.

TABLE 9

| Etching process | Gas | Pressure | Temp. | He Pressure | Time | ICP power |
|---|---|---|---|---|---|---|
| condition | CHF3: 50 sccm Ar: 15 sccm | 40 mTorr | 20° C. | 10 Torr | 60 min | 2000 W |

The results of the plasma resistance test at 20° C. can be confirmed in Table 10 below.

TABLE 10

|  | Plasma resistance test (ETCH RATE [nm/min] ) |
|---|---|
| Comparative Example 1 | 18.03 |
| Comparative Example 2 | 23.38 |
| Comparative Example 3 | 19.98 |
| Comparative Example 4 | 3.92 |
| Comparative Example 5 | 4.48 |
| Comparative Example 6 | 4.88 |
| Example 1 | 3.75 |
| Example 2 | 1.67 |
| Example 3 | 1.58 |
| Example 4 | 2.25 |
| Example 5 | 0.35 |

* unit: nm/min

In the case of Comparative Example 1 to Comparative Example 5 shown in Table 10 above, these are the results of a plasma resistance test for a ceramic susceptor composed of a ceramic plate layer formed from a bulk material without forming a coating layer.

In the case of the ceramic susceptors of Comparative Example 1 and Comparative Example 2 made of AlN and $Al_2O_3$ bulk materials, which are most commonly used as existing ceramic susceptors, it was confirmed that although these ceramic susceptors show better plasma resistance compared to susceptors made of conventional metal materials, the plasma resistance is significantly lower than the ceramic susceptor of Comparative Example 4 and Comparative Example 5 made of $Y_2O_3$ and YAG bulk materials, which are used in various fields as plasma resistance materials. Even in the case of the ceramic susceptor of Comparative Example 3, which consists of a ceramic plate layer manufactured according to Manufacturing Example 18 of the first embodiment of the present invention, it shows plasma resistance characteristics that are not significantly different from Comparative Examples 1 and 2.

However, in recent semiconductor manufacturing processes that use high-output plasma and are performed in a high temperature environment of 500° C. or higher, a higher plasma resistance and particle resistance are required, and the plasma resistance equivalent to the level of $Y_2O_3$ and YAG bulk materials shown in Comparative Examples 4 and 5 above is required, but in the case of the $Y_2O_3$ and YAG materials, these are composed of expensive rare earth elements, and have difficulties in forming sintered bodies with complex shapes and difficulties such as not satisfying the physical properties such as volume resistance and thermal conductivity required by ceramic susceptors, thereby making it difficult to use them as bulk materials, and thus as shown in Comparative Example 6 above, it is mainly used as a coating layer.

In the case of Comparative Example 6, it is manufactured by forming a $Y_2O_3$ coating layer on the ceramic plate manufactured according to Manufacturing Example 18 of the first embodiment of the present invention, using the conventional suspension plasma spray (SPS) or aerosol deposition (AD) process. Although it shows high plasma resistance similar to the ceramic susceptor made of bulk materials $Y_2O_3$ and YAG shown in Comparative Examples 4 and 5 above, there is a problem that peeling of the coating layer occurs in a high temperature environment of 500° C. or higher, which is the actual temperature for use, so it cannot be used in a high temperature environment, as shown in Experiment Example 2 above.

On the other hand, it was confirmed that the ceramic susceptors of Examples 1 to 5 manufactured according to the first embodiment of the present invention not only show plasma resistance equivalent to or higher than that of the ceramic susceptor manufactured from bulk material $Y_2O_3$ or YAG, as shown in Table 10 above, but also show relatively low porosity, as shown in Experiment Example 2 and FIG. 6 above, and these not only form an even and stable joint surface by the reaction layer formed at the interface between the ceramic plate layer and the first coating layer, but also shows a dense bonding structure, and thus have excellent plasma resistance and particle reduction effect without peeling of the coating layer even in a high temperature environment of 500° C.

In particular, since the results of the plasma resistance test in Example 2 to Example 4, which used a mixture of Y 03 and YAG at a certain ratio when forming the first coating layer, were found to be superior to the result of the plasma resistance test in Example 1, which used $Y_2O_3$ alone to form the first coating layer, when forming the first coating layer, it may be desirable to use a mixture of two or more of the Y compounds ($Y_2O_3$, $YF_3$, YOF, YAG, YAS, YAM, and YAP).

In addition, in the case of Example 5, in which a second coating layer was additionally formed by a sputtering process on the first coating layer formed by hot press sintering, since the results of the porosity and plasma resistance tests were shown to be the best, it may be more desirable to secure a stable joint surface and a dense joint structure by forming a first coating layer of Y compound by hot pressing according to the present invention and thus forming a reaction layer by reactive sintering at the interface between the ceramic plate layer and the first coating layer, and to improve plasma resistance by forming a second coating layer composed of the Y compound on the first coating layer through various conventional deposition processes, such as sputtering, and thus keeping the porosity of the surface of the coating layer lower.

As discussed above, the ceramic susceptor according to the present invention is a ceramic susceptor comprising a ceramic plate layer and a first coating layer located on the ceramic plate layer, which is characterized in that the ceramic plate layer contains alumina ($Al_2O_3$) and aluminum nitride (AlN) and does not contain an aluminum oxynitride phase (AlON phase), and it comprises a reaction layer formed by reactive sintering at the interface between the ceramic plate layer and the first coating layer. Here, the first coating layer is formed by a hot press method, and a second coating layer may be further comprised on the first coating layer to further improve plasma resistance and particle resistance, and the second coating layer is formed by a sputtering process, and not only satisfies the ceramic properties of having a volumetric resistance of 1.0E+10 to 1.0E+13Ω·cm at 500° C. and a thermal conductivity of 30 to 60 W/m·k or more at room temperature, but also has the advantage of having plasma resistance equivalent to or better than $Y_2O_3$ or YAG bulk material without peeling off the coating layer even in a high temperature process of 500° C. and thus having a particle reduction effect.

The invention claimed is:

1. A ceramic susceptor comprising a ceramic plate layer; and a coating layer located on the ceramic plate layer,
wherein the ceramic plate layer contains alumina ($Al_2O_3$); and aluminum nitride (AlN) and does not contain an aluminum oxynitride phase (AlON phase), and comprises a reaction layer formed at an interface between the ceramic plate layer and the coating layer,
wherein a content of the alumina is in excess of 68% by weight and less than 95% by weight based on a total weight of the ceramic plate layer,
a content of the aluminum nitride is more than 5% by weight and less than 32% by weight based on the total weight of the ceramic plate layer, and
wherein the ceramic susceptor has a volumetric resistance rate of 1.0E+10 to 1.0E+13 Ω·cm at 500° C. and a thermal conductivity of 30 to 60 W/m·k at room temperature.

2. The ceramic susceptor according to claim 1, wherein the coating layer contains one or more of $Y_2O_3$, $YF_3$, YOF, YAG, YAS, YAM and YAP, and the reaction layer contains one or more of YAG, YAM and YAP.

3. The ceramic susceptor according to claim 1, wherein the coating layer is formed on the ceramic plate layer by hot pressing, and the reaction layer is formed by reaction and sintering of components contained in the ceramic plate layer and the coating layer.

4. The ceramic susceptor according to claim 1, wherein the coating layer includes a first coating layer located on the ceramic plate layer; a second coating layer located on the first coating layer; and a reaction layer formed at the interface between the first coating layer and the ceramic plate layer, wherein the first coating layer and the second coating layer contain one or more of $Y_2O_3$, $YF_3$, YOF, YAG, YAS, YAM and YAP, and the reaction layer contains one or more of YAG, YAM and YAP.

5. The ceramic susceptor according to claim 4, wherein the first coating layer is formed on the ceramic plate layer by hot pressing,
the second coating layer is formed on the first coating layer by sputtering, and
the reaction layer is formed by reactive sintering of components contained in the ceramic plate layer and the first coating layer.

6. The ceramic susceptor according to claim 1, wherein the ceramic plate layer further contains any one or more dopant of magnesium oxide (MgO), yttria ($Y_2O_3$), graphene, and rare earth complex oxides.

7. The ceramic susceptor according to claim 6, wherein the dopant is contained in an amount of 0.05 to 2 parts by weight, based on a total weight of 100 parts by weight of the alumina and aluminum nitride.

8. The ceramic susceptor according to claim 6, wherein the dopant contains magnesium oxide and graphene, and
the magnesium oxide is contained in an amount of 0.05 to 0.5 parts by weight, and the graphene is contained in an amount of 0.05 to 0.5 parts by weight, based on a total weight of 100 parts by weight of the alumina and aluminum nitride.

9. The ceramic susceptor according to claim 6, wherein the dopant contains magnesium oxide, graphene, and yttria, and
the magnesium oxide is contained in an amount of 0.05 to 0.5 parts by weight, the graphene is contained in an amount of 0.05 to 0.5 parts by weight, and the yttria is contained in an amount of 0.05 to 0.5 parts by weight, based on a total weight of 100 parts by weight of the alumina and aluminum nitride.

10. The ceramic susceptor according to claim 6, wherein the dopant contains magnesium oxide, graphene, yttria, and rare earth complex oxides, and
the magnesium oxide is contained in an amount of 0.05 to 0.5 parts by weight, the graphene is contained in an amount of 0.05 to 0.5 parts by weight, the yttria is contained in an amount of 0.05 to 0.5 parts by weight, and the rare earth complex oxides is contained in an amount of 0.05 to 0.5 parts by weight, based on a total weight of 100 parts by weight of the alumina and aluminum nitride.

11. The ceramic susceptor according to claim 6, wherein the ceramic plate layer has a volumetric resistance rate of 1.0E+10 to 1.0E+13Ω·cm at 500° C. and a thermal conductivity of 40 to 60 W/m·k at room temperature.

* * * * *